United States Patent
Usui et al.

(10) Patent No.: US 11,145,770 B2
(45) Date of Patent: Oct. 12, 2021

(54) SEMICONDUCTOR LIGHT RECEIVING ELEMENT

(71) Applicant: KYOTO SEMICONDUCTOR CO., LTD., Kyoto (JP)

(72) Inventors: Ken Usui, Kyoto (JP); Takatomo Isomura, Kyoto (JP); Etsuji Omura, Kyoto (JP)

(73) Assignee: Kyoto Semiconductor Co., Ltd., Kyoto (JP)

( * ) Notice: Subject to any disclaimer, the term of this patent is extended or adjusted under 35 U.S.C. 154(b) by 0 days.

(21) Appl. No.: 16/772,051

(22) PCT Filed: Feb. 1, 2018

(86) PCT No.: PCT/JP2018/003452
§ 371 (c)(1),
(2) Date: Jun. 11, 2020

(87) PCT Pub. No.: WO2019/150533
PCT Pub. Date: Aug. 8, 2019

(65) Prior Publication Data
US 2020/0365745 A1 Nov. 19, 2020

(51) Int. Cl.
*H01L 31/0232* (2014.01)
*H01L 31/105* (2006.01)

(52) U.S. Cl.
CPC ...... *H01L 31/02327* (2013.01); *H01L 31/105* (2013.01)

(58) Field of Classification Search
None
See application file for complete search history.

(56) References Cited

U.S. PATENT DOCUMENTS

| 2009/0121305 A1* | 5/2009 | Pan | H01L 31/107 257/436 |
| 2009/0242028 A1 | 10/2009 | Origlia et al. | |
| 2009/0283679 A1 | 11/2009 | Murayama et al. | |
| 2013/0187181 A1* | 7/2013 | Koyama | H01L 33/58 257/98 |

(Continued)

FOREIGN PATENT DOCUMENTS

| JP | 59-90964 A | 5/1984 |
| JP | 05-136446 A | 6/1993 |

(Continued)

*Primary Examiner* — Andres Munoz
(74) *Attorney, Agent, or Firm* — Norris McLaughlin, P.A.

(57) ABSTRACT

A semiconductor light receiving element comprises a light absorption region formed in the vicinity of the main surface of the semiconductor substrate transparent to the incident light; an incident region set to be concentric with and larger than the light absorption region; and a partially spherical concave reflecting portion formed on a back surface of the semiconductor substrate and capable of reflecting incident light incident on the incident region from the main surface side toward the light absorbing region; wherein, when the radius of curvature of the portion is R, the diameter of the incident region is B, the distance between the light absorbing region and the concave reflecting portion is W, and the diameter of the light absorbing region is P, then the radius of curvature R satisfies a condition of $2BW/(B-P/2) \leq R \leq 2BW/(B-P)$.

2 Claims, 14 Drawing Sheets

(56) References Cited

U.S. PATENT DOCUMENTS

| | | | |
|---|---|---|---|
| 2014/0367820 A1* | 12/2014 | Lin | H01L 31/115 |
| | | | 257/432 |
| 2016/0049528 A1* | 2/2016 | Cho | H01L 31/035281 |
| | | | 257/432 |
| 2016/0247841 A1* | 8/2016 | Cheng | H01L 31/109 |

FOREIGN PATENT DOCUMENTS

| | | |
|---|---|---|
| JP | 2995921 B | 10/1999 |
| JP | 2001-308366 A | 11/2001 |
| JP | 2009-302519 A | 12/2009 |
| JP | 2013-171920 A | 9/2013 |
| JP | 2013-201369 A | 10/2013 |
| JP | 2013-225586 A | 10/2013 |

\* cited by examiner

SEMICONDUCTOR LIGHT RECEIVING ELEMENT

TECHNICAL FIELD

The present invention relates to a semiconductor light receiving element that converts received incident light into an electric signal and outputs the electric signal, and more particularly to a semiconductor light receiving element that can reflect incident light and introduce it into a light receiving part.

BACKGROUND ART

In the field of optical communication, developments have been made to increase the transmission speed in order to cope with a sudden increase in the amount of communication. In optical communication, an optical signal is transmitted from a transmitting side via an optical fiber cable, and the optical signal received by a semiconductor light receiving element is converted into an electric signal on a receiving side.

Increasing of the transmission speed on the receiving side is realized by increasing the response speed of the semiconductor light receiving element. For that purpose, it is necessary to improve the upper limit of the response speed defined by the element capacitance and the element resistance. The element capacitance becomes smaller as the area of the light receiving part of the semiconductor light receiving element, that is, the diameter of the light absorption region that converts light into electricity (charge) becomes smaller. For example, when a semiconductor light receiving element having a response frequency band of about 20 GHz is realized, if the diameter of the light absorption region is about 20 μm, the device capacity will be sufficiently small.

On the other hand, the smaller the diameter of the light absorbing region, the smaller the light receiving area and the smaller the amount of received light, so that the receiving efficiency (sensitivity) decreases. In addition, when the beam diameter of the incident light is small, it is necessary to adjust the incident position so that the light is surely incident on the small light absorption region, and the deviation of the incident position sensitively affects the sensitivity. Therefore, it is difficult to achieve both high response speed and high sensitivity of the semiconductor light receiving element.

Also in the field of optical measurement, there is a demand to increase the light receiving area as much as possible to improve sensitivity while maintaining the frequency response characteristics of the semiconductor light receiving element. For example, there is a demand for a semiconductor light receiving element having a light receiving area diameter of about 200 μm and a response frequency band of 150 MHz. But, even if the diameter of the light receiving area is made small to be 200 μm, a response frequency band remains to be several tens MHz, the required performance cannot be satisfied.

In order to realize such a high response speed and an improvement in sensitivity, for example, as disclosed in Patent Document 1, there is known a semiconductor light receiving element including a light absorption region formed thinly on the main surface of the semiconductor substrate and a reflecting portion formed on a back surface of the semiconductor substrate so as to face with the light absorption region, and configured so that light that has entered a light absorbing region from the main surface side and transmitted therethrough is reflected by the reflecting portion and again enters the light absorbing region.

In addition, as in Patent Document 2, there is known a semiconductor light receiving element including a light absorbing region provided at the center of a convex lens-shaped or Fresnel lens-shaped light receiving window formed on the main surface of a semiconductor substrate, and a flat reflecting portion provided on the back surface of the semiconductor substrate, and configured so as to make light incident on a light receiving window from a main surface side condense on the reflection portion, and reflects the light incident on the reflection portion so as to condense it on a light absorption region.

PRIOR ART DOCUMENTS

Patent Documents

Patent Document #1: Japanese Patent Publication 2995921.

Patent Document #2: Japanese Laid-Open Patent Publication H05-136446.

SUMMARY OF THE INVENTION

Technical Problem

In Patent Document #1, the area of the light absorbing region is the light receiving area, and it is difficult to secure a sufficient amount of received light even if reflected light is used when the light absorbing region is reduced. In addition, it is necessary to precisely adjust the incident position of the incident light in order to ensure that the light is incident on the small light absorption region. In the reduced light absorption region for high frequency response, the deviation of incident light affects the sensitivity heavily.

In Patent Documents #2, the area of the light receiving window corresponds to the light receiving area, and even if the light absorbing area is reduced, by means of a large light receiving area, both high response speed and improved sensitivity can be secured. However, after formation of the light receiving area, it is necessary to process the periphery into a convex lens shape or a Fresnel lens shape, and it is not easy to perform this processing without affecting the light absorption region. In addition, when the lens condenses light so that it focuses on the light absorbing area, charges are generated intensively near the focal point and the high response speed may be hindered by the space charge effect where charge transition is restricted due to extreme condensation of charges.

SUMMARY OF THE INVENTION

An object of the present invention is to provide a semiconductor light receiving element capable of achieving both high response speed and high sensitivity.

Means to Solve the Problems

The first invention presents a semiconductor light receiving element including a light absorbing region formed in a vicinity of a main surface of a semiconductor substrate transparent to an incident light, an incident region set concentrically with the light absorbing region and larger than the light absorbing region, and a partially spherical concave reflecting portion provided on a back surface opposite to the main surface of the semiconductor substrate and capable of reflecting incident light incident on the incident region from the main surface side of the semiconductor substrate toward the light absorbing region; wherein, when a radius of curvature of the concave reflecting portion is R, a diameter of the incident region is B, a distance in the semiconductor substrate between the light absorbing region and the concave reflecting portion is W, and a diameter of the light absorbing region is P, then the radius of curvature R satisfies a condition of $R \leq 2BW/(B-P)$ in order to avoid reduction of a coupling efficiency, and satisfies a condition of $R \geq 2BW/(B-P/2)$ in order to avoid a space charge effect.

According to the above semiconductor light receiving element, of the incident light that has entered the incident region from the main surface side of the semiconductor substrate, the incident light that has not entered the light absorbing region is reflected toward the light absorbing region by the partial spherical concave reflecting portion. Then, the incident light incident on the incident region can be efficiently introduced into the light absorbing region, the curvature of the concave reflecting portion is set so as to introduce the reflected incident light while suppressing excessive collection of the incident light reflected by the concave reflecting portion. Therefore, the light absorption area can be made smaller than the incident area, and while suppressing the space charge effect, the response speed of the semiconductor light receiving element can be increased, and by means of securing the light receiving area corresponding to the area of the incident area, the sensitivity can be improved. In addition, since a light receiving area larger than the light absorption region is secured, a decrease in sensitivity due to a deviation in the incident position of the incident light can be suppressed even in a small light absorption region.

The second invention presents a semiconductor light receiving element including a light absorption region formed in a vicinity of a main surface of a semiconductor substrate transparent to an incident light, an incident region set concentrically with the light absorption region and larger than the light absorption region, and a revolving paraboloid shaped concave reflecting portion provided on a back surface opposite to the main surface of the semiconductor substrate and capable of reflecting incident light incident on the incident region from the main surface side of the semiconductor substrate toward the light absorbing region; wherein, when a radius of curvature of a partial spherical surface approximating the rotating paraboloid shape of the concave reflecting portion is R, a diameter of the incident region is B, a distance in the semiconductor substrate between the light absorbing region and the concave reflecting portion is W, and a diameter of the light absorbing region is P, then the radius of curvature R satisfies a condition of $R \leq 2BW/(B-P)$ in order to avoid reduction of a coupling efficiency, and satisfies a condition of $R \geq 2BW/(B-P/2)$ in order to avoid a space charge effect.

According to the above semiconductor light receiving element, of the incident light that has entered the incident region from the main surface side of the semiconductor substrate, the incident light that has not entered the light absorption region is reflected by the concave reflecting portion having a revolving paraboloid shape so as to be focused toward the light absorption region. Then, the incident light incident on the incident region can be efficiently introduced into the light absorbing region, and the curvature of concave reflecting portion is set so as to introduce the reflected incident light while suppressing excessive collection of the incident light reflected by the concave reflecting portion. Therefore, the light absorption area can be made smaller than the incident area, and while suppressing the space charge effect, the response speed of the semiconductor light receiving element can be increased, and by means of securing the light receiving area corresponding to the area of the incident area, the sensitivity can be improved. In addition, since a light receiving area larger than the light absorption region is secured, a decrease in sensitivity due to a deviation in the incident position of the incident light can be suppressed even in a small light absorption region.

Advantages of the Invention

According to the semiconductor light receiving element of the present invention, it is possible to achieve both a high response speed and an improvement in sensitivity.

DESCRIPTION OF EMBODIMENT

Best mode for implementing the present invention will now be explained on the basis of embodiments.

First, the overall configuration of the semiconductor light receiving element 1 will be described.

Figure 1:
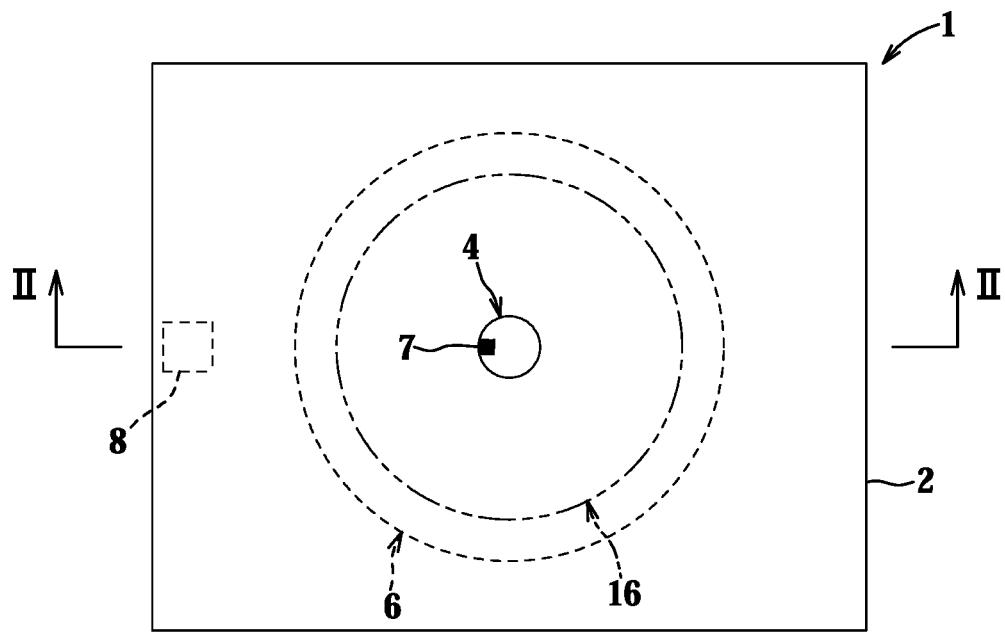
FIG. 1 is a plan view of a semiconductor light receiving element according to an embodiment of the present invention.
Figure 2:
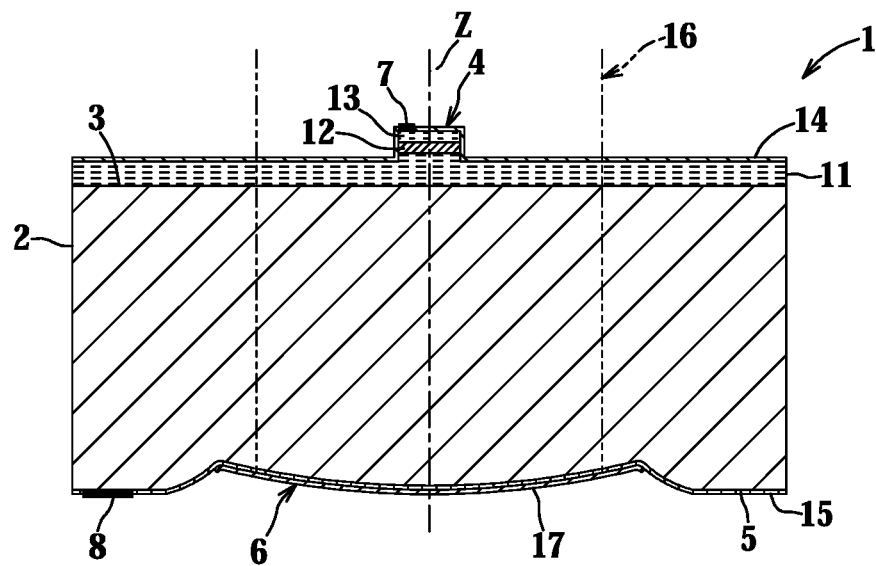
FIG. 2 is a sectional view taken along line II-II of FIG. 1.

As shown in FIGS. 1 and 2, a semiconductor light receiving element 1 comprises a semiconductor substrate 2, a light receiving part 4 disposed in a vicinity of a main surface 3 of the semiconductor substrate 2, a concave reflecting portion 6 disposed on a back surface 5 opposite to the main surface 3 of the semiconductor substrate 2, a p-electrode 7 connected to the light receiving part 4 and an n-electrode 8 connected to the back surface 5 of the semiconductor substrate 2. The semiconductor substrate 2 is an n-InP substrate and is transparent to infrared light having a wavelength longer than 1 μm. The infrared light having a wavelength longer than 1 μm incident on the semiconductor substrate 2 travels inside the semiconductor substrate 2. In addition, as the semiconductor substrate 2, a substrate material such as a Si substrate can be appropriately selected according to the use of the semiconductor light receiving element 1.

A first n-InP layer 11 having a thickness of, for example, 5 μm is uniformly formed on the main surface 3 of the semiconductor substrate 2, and a light receiving part 4 is provided on the first n-InP layer 11. The light receiving part 4 has, in order from the first n-InP layer 11 side, a light absorption region 12 made of, for example, a InGaAs layer of 1 μm thickness and a p-type diffusion region 13 having a thickness of 2 μm, when a high speed response of about 10 GHz is required, a cylindrical pin photodiode having a diameter of 40 μm is formed as the light receiving part 4. Light enters the light absorption region 12 from the p-type diffusion region 13 side and from the first n-InP layer 11 side (i.e. from the main surface 3 side), and the incident light is absorbed to generate electric charges. The p-electrode 7 is connected to the p-type diffusion region 13, and the surface of the first n-InP layer 11 and a portion other than the p-electrode 7 of the light receiving part 4 are provided with an antireflection film 14 (for example, a silicon nitride film of 100 nm thickness) for preventing reflection of incident light.

On the back surface 5 of the semiconductor substrate 2, there is provided a concave reflecting portion 6 having a convex shape on the side opposite to the main surface 3 and having a partially spherical shape, for example, and having a width (outer diameter) of 300 μm. The back surface 5 is covered with a dielectric film 15 (for example, a silicon oxide film having a thickness of 100 nm). The concave reflecting portion 6 is disposed such that the apex of the concave reflecting portion 6 (the point most protruding on the side opposite to the main surface 3) coincides with the axis Z of the circular light receiving part 4. An incident area 16 larger in diameter than the light receiving part 4 having a diameter of, for example, 200 μm is set concentrically with the light absorption area 12. A dielectric film 15 and a metal film 17 (for example, a laminated film of a chromium film having a thickness of 10 nm and a gold film having a thickness of 40 nm) are formed on the concave reflecting portion 6 in this order from the semiconductor substrate 2 side. A reflection film having a high reflectance with respect to incident light from the main surface 3 is formed.

Figure 3:
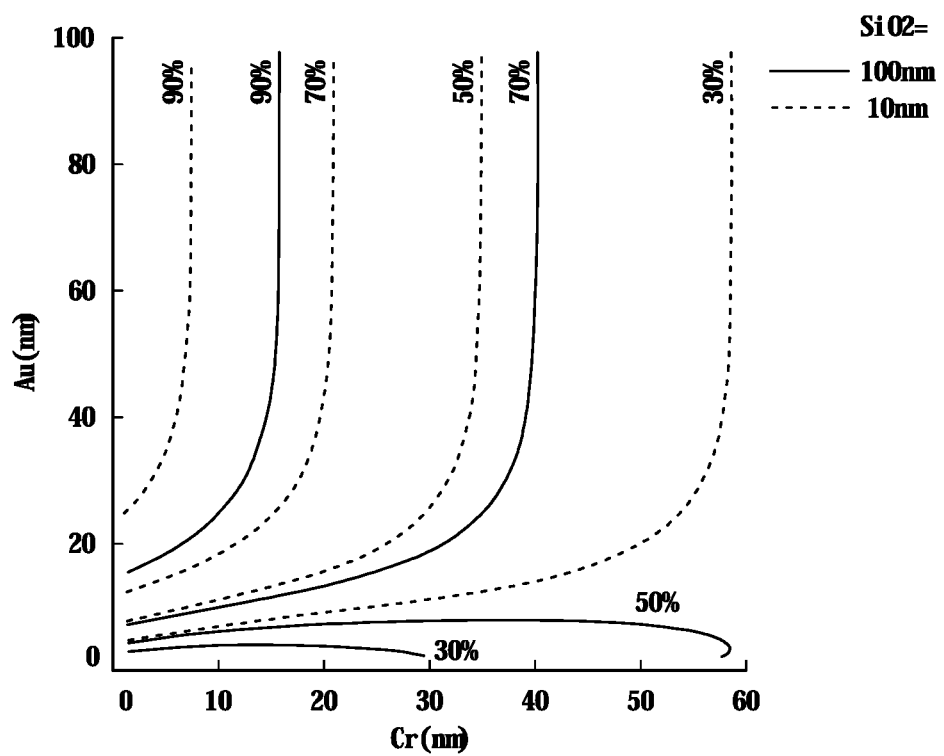
FIG. 3 is a diagram showing the film thickness dependence of the reflectance of a reflective film of a concave reflecting portion.

FIG. 3 shows the calculation result of the reflectance when the film thicknesses of the silicon oxide film, the chromium film, and the gold film constituting the reflection film are changed in a contour line by connecting points having the same reflectance. The calculation of the reflectance is performed on the assumption that the incident light is perpendicularly incident on the reflection film from the semiconductor substrate 2, and the refractive indices of the semiconductor substrate 2 and the silicon oxide film are 3.224 and 1.45, respectively, and the complex refractive indices of the chromium film and the gold film are 3.6-j3.6 and 0.55-j11.5, respectively (j is an imaginary unit). The chromium film functions as an adhesion layer between the silicon oxide film and the gold film. In order to obtain a high reflectance exceeding 90%, depending on the thickness of the silicon oxide film, when the thickness of the silicon oxide film is 100 nm, the thickness of the chromium film is about 10 nm, and the gold film of 40 nm thickness is sufficient.

Figure 4:
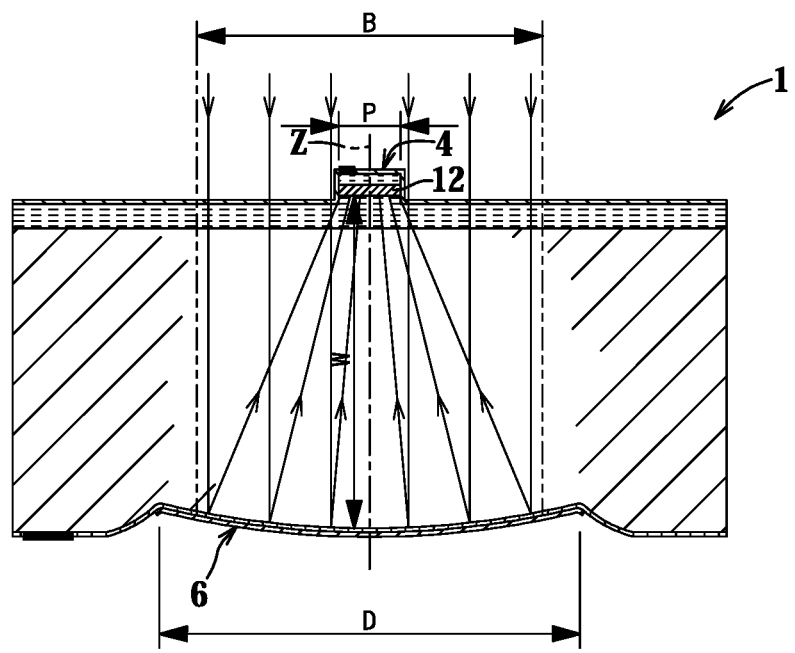
FIG. 4 is a diagram showing an example in which incident light composed of parallel rays is incident on a semiconductor light receiving element having a concave reflecting portion having an upper limit radius of curvature R.

The concave reflecting portion 6 has a radius of curvature R determined so that incident light from the light receiving part 4 side, which is incident on the incident region 16 in parallel with the axis Z and reaches the concave reflecting portion 6, can be reflected toward the light absorbing region 12. As shown in FIG. 4, when, for example, the diameter P of the light absorbing region 12 having a circular shape in a plan view is 40 μm, the distance W between the light absorbing region 12 and the apex of the concave reflecting portion 6 is 150 μm, the outer diameter D of the concave reflecting portion 6 is 300 μm, and the diameter B of the incident area 16 is 200 μm, by setting the radius of curvature R to 375 μm or less, the incident light incident on the incident area 16 from the light receiving part 4 side in parallel to the axis Z of the light receiving part 4 is reflected by the reflecting portion 6 and can be efficiently guided to the light absorption region 12. When the radius of curvature R is larger than this, the incident light incident on the outer peripheral side portion of the incident region 16 is reflected so as to pass radially outward from the light absorbing region 12 and does not enter the light absorbing region 12, thereby lowering the coupling efficiency. Here, the coupling efficiency is a ratio of light incident on the light absorption region 12 in the incident light.

On the other hand, as the radius of curvature R is reduced, the incident light incident on the incident area 16 is condensed on the central part of the light absorbing area 12 by the concave reflecting portion 6, and eventually focuses on the central part of the light absorbing area 12. If the light is excessively condensed on the central portion of the light absorbing region 12, the charges generated by the incident light are excessively concentrated on the central portion of the light absorbing region 12, and the movement of the charges is restricted by the space charge effect due to the charge concentration. Therefore, the increase in the response speed of the semiconductor light receiving element 1 is hindered. In order to avoid the reduction in the coupling efficiency and the space charge effect, the radius of curvature R is set so as to satisfy the following conditional expression (1).

$$2BW/(B-P/2) \leq R \leq 2BW/(B-P) \qquad (1)$$

Figure 5:
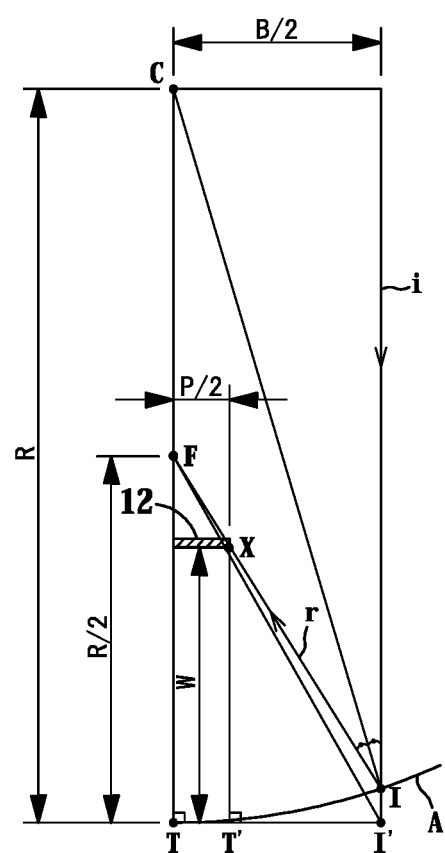
FIG. 5 is a diagram illustrating an upper limit of a radius of curvature R of the concave reflecting portion.

Here, conditional expression (1) for the radius of curvature R will be described. As shown in FIG. 5, the concave reflecting portion 6 is represented by an arc A having a radius of curvature R, the apex of the concave reflecting portion 6 is T, the center of the arc A having a radius of curvature R is C, the intersection of arc A and incident light i on the outermost periphery of the incident area 16 having a diameter B in parallel with the axis Z is defined as I. The reflected light beam r of the light beam i so that the incident angle and the reflection angle are equal to the line segment CI reaches the focal point F of the concave reflecting portion 6 having the radius of curvature R on the line segment CT. The distance (focal length) between the apex T and the focal point F is approximated to R/2. For the sake of simplicity, the intersection of the tangent at the apex T of the arc A and the extension of the ray i is defined as I', and a figure composed of the line segment FT, the reflected ray r, and the arc TI is approximated by a triangle FTI'.

When the light absorbing region 12 having the diameter P is located at a distance W from the apex T, the upper limit of the radius of curvature R is set when the reflected light beam r is incident on the outermost peripheral portion of the light absorbing region 12. In this case, let X be an intersection of a line segment FI' approximating the reflected ray r and the light absorption region 12, and let T' be an intersection of a perpendicular drawn from the intersection X to the line segment TI'. Using the fact that the triangle FTI' and the triangle XTT' are similar, the upper limit radius of curvature R=2BW/(B−P) of the conditional expression (1) is derived. When the diameter P of the light absorbing region 12 is 40 μm, the distance W between the light absorbing region 12 and the apex of the concave reflecting portion 6 is 150 μm, and the diameter B of the incident region 16 is 200 μm, the upper limit radius of curvature R is 375 μm.

Figure 6:
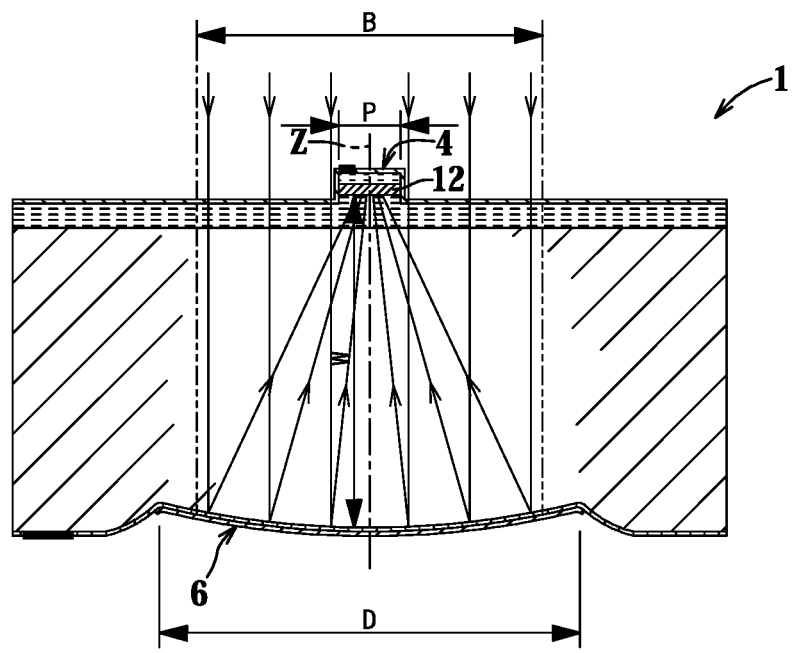
FIG. 6 is a diagram illustrating an example in which incident light composed of parallel rays is incident on a semiconductor light receiving element having a concave reflecting portion having a lower limit radius of curvature R.

As shown in FIG. 6, when the radius of curvature R of the concave reflecting portion 6 is set to 330 μm in the semiconductor light receiving element 1 of FIG. 4, the central portion of the light absorbing region 12 receives the incident light reflected by the concave reflecting portion 6. The space charge effect cannot be ignored due to the concentration of charges generated in the central portion. At this time, the light ray i incident on the outermost peripheral portion of the incident region 16 having the diameter B is incident on a position shifted from the outermost peripheral portion of the light absorbing region 12 by P/4 toward the center. When this case is set as the lower limit of the radius of curvature R and the similarity of the triangle is used as in FIG. 5, the lower limit of the radius of curvature R of the conditional expression (1) is derived to be R=2BW/(B−P/2). When the diameter P of the light absorbing region 12 is 40 μm, the distance W between the light absorbing region 12 and the apex of the concave reflecting portion 6 is 150 μm, and the diameter B of the incident region 16 is 200 μm, the lower limit radius of curvature R is 333 μm. The curvature radius R is set so as to satisfy the conditional expression (1) set in this manner, and the incident light is efficiently introduced into the light absorbing region 12 to achieve both a high response speed and an improvement in sensitivity of the semiconductor light receiving element 1.

Up to this point, a case has been described in which parallel beam like incident light having a large beam diameter is incident on the semiconductor light receiving element 1. However, the beam diameter of light transmitted through an optical fiber for optical communication is narrowed, and the output of the optical fiber is reduced. The light emitted from the end of the optical fiber spreads in a conical shape having a vertex angle of about 14°, and also spreads in the semiconductor substrate 2 in a conical shape with a smaller apex angle according to the law of refraction. It is necessary to adjust the position of the output end of the optical fiber so that the conical incident light is directly incident on the light receiving part 4, but this adjustment is not easy.

Figure 7:
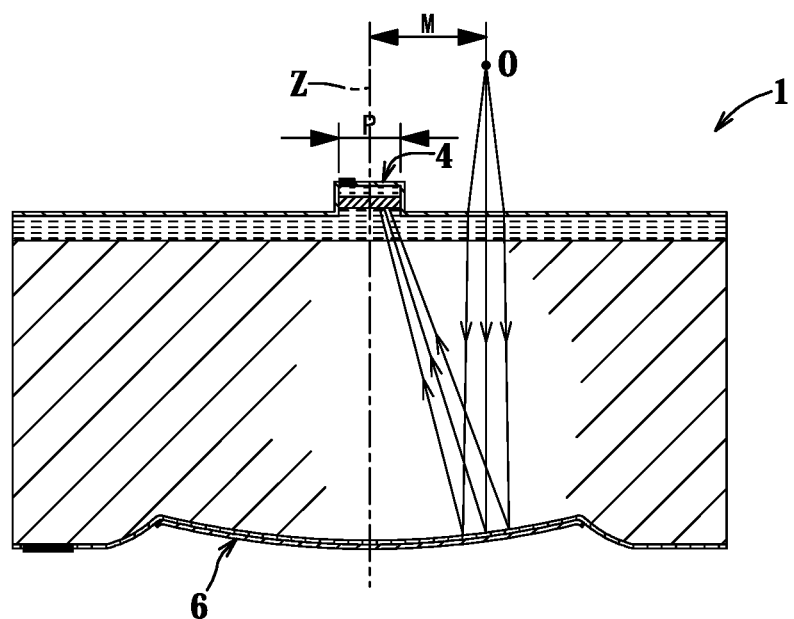
FIG. 7 is a diagram illustrating an example in which incident light composed of a diffused light is incident on the semiconductor light receiving element while being deviated from the center of the light receiving part.
Figure 8:
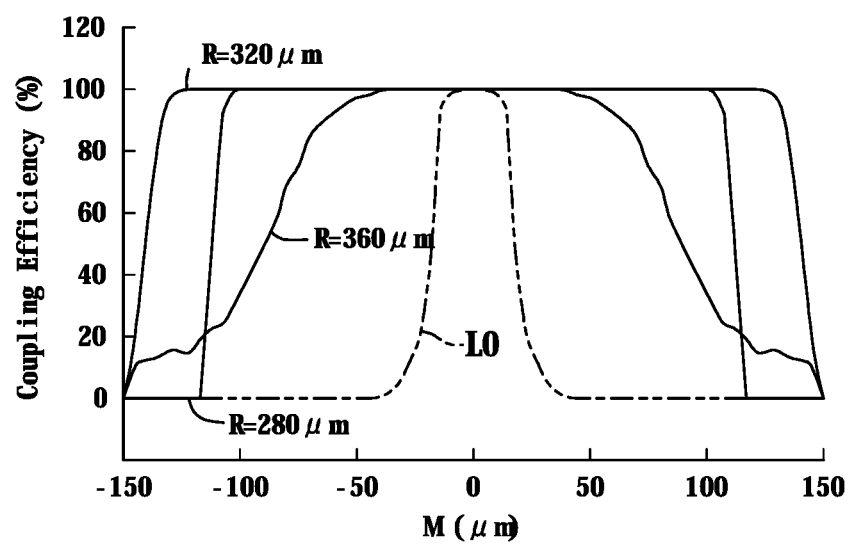
FIG. 8 is a diagram showing the influence of the radius of curvature of the concave reflecting portion in terms of coupling efficiency.

In this case as well, as shown in FIG. 7, if the diameter P of the light absorbing region 12 is, for example, 40 μm and the semiconductor light receiving element 1 includes the concave reflecting portion 6 having the radius of curvature R satisfying the conditional expression (1) is used, cone shaped incident light can be reflected by the concave reflecting portion 6 and guided to the light absorption region 12. For example, when the apex angle of the light emitted from the optical fiber is 14°, FIG. 8 shows a relationship between the distance M from the emission position O to the axis Z of the light receiving part 4 and the coupling efficiency. In the case where the concave reflecting portion 6 is not provided, the coupling efficiency sharply decreases when the emission position O is displaced by about 15 μm from the axis Z as shown by the line L0. The full width at half maximum (FWHM) at which the coupling efficiency is reduced to 50% is about 40 μm, and it is necessary to adjust the emission position O within this range. When there is reflection from the concave reflecting portion 6, for example, when the radius of curvature R is 360 μm, the FWHM is about 180 μm, the allowable incident position deviation is enlarged, and the effective light receiving area is increased.

Figure 9:
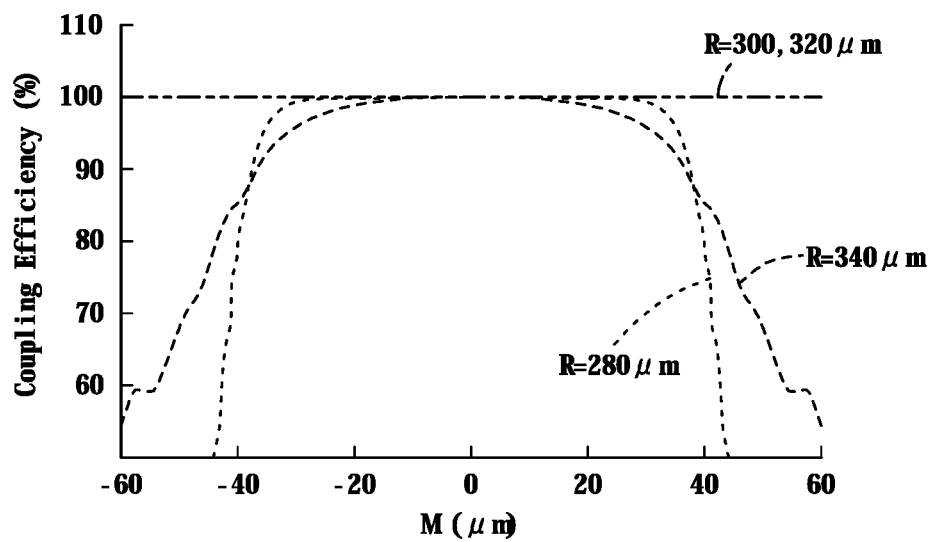
FIG. 9 is a diagram showing the effect of reducing the light receiving area diameter to 10 μm in terms of coupling efficiency in order to increase the response speed.

In order to further increase the response speed, the diameter P of the light absorbing region 12 is set to 10 μm, and when W=150 μm and B=200 μm, the conditional expression (1) is calculated as 308 μm≤R≤315 μm. As shown in FIG. 9, the semiconductor light receiving element 1 provided with the concave reflecting portion 6 having above described radius R can secure a FWHM of 120 μm or more, enlarge an allowable incident position deviation, and increase an effective light receiving area.

Next, a method for manufacturing the semiconductor light receiving element 1 will be described.

Figure 10:
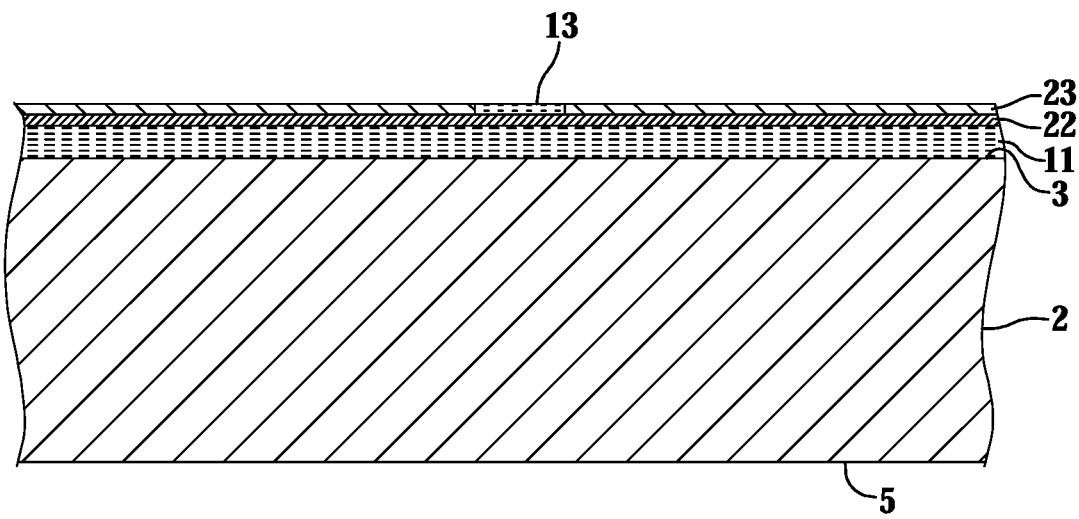
FIG. 10 is a cross-sectional view showing a step of forming a diffusion layer on a semiconductor substrate.

As shown in FIG. 10, a first n-InP layer 11, an InGaAs layer 22, and a second n-InP layer 23 are sequentially formed on a main surface 3 of a clean semiconductor substrate 2 by a vapor deposition method or the like. Then, a non-illustrated diffusion mask (for example, a silicon nitride film) is formed to cover a region other than the predetermined region of the second n-InP layer 23, and a p-type diffusion region 13 in which, for example, Zn is diffused to a predetermined region by a selective diffusion method is formed.

Figure 11:
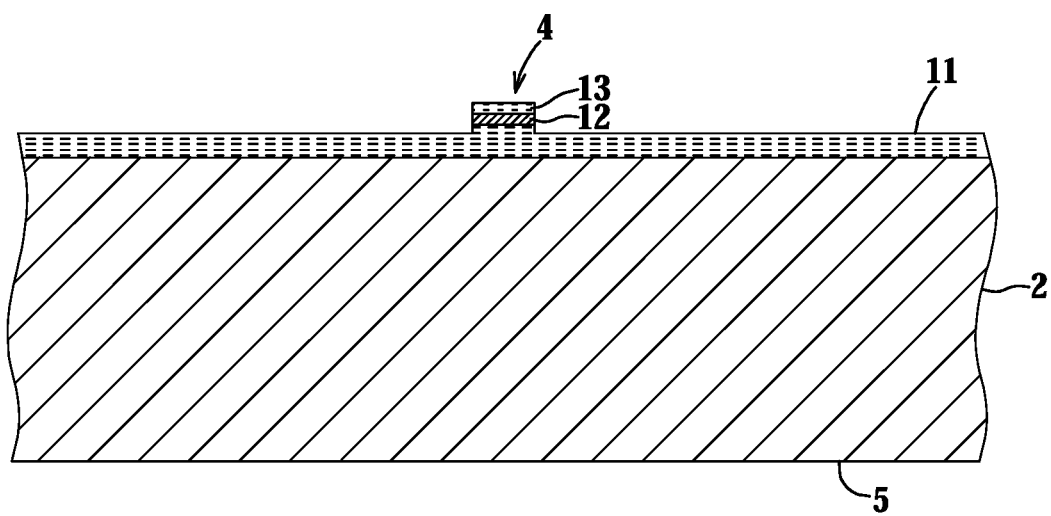
FIG. 11 is a cross-sectional view showing a step of forming a light receiving portion on the semiconductor substrate of FIG. 10.

Next, as shown in FIG. 11, the second n-InP layer 23 and the InGaAs layer 22 is selectively etched by a selective etching method so that the first n-InP layer 11 is exposed while leaving a predetermined portion including the p-type diffusion region 13, thereby to form the light receiving part 4 including the light absorbing region 12. For example, although not shown, an etching mask (for example, a photoresist or a dielectric film such as a silicon nitride film) covering the p-type diffusion region 13 is formed on the second n-InP layer 23, and etching is performed so that the n-InP layer 11 is exposed. At this time, the upper surface of the first n-InP layer 11 is also etched and becomes thinner. In the case of chemical etching, a commonly used etchant is a mixture of hydrogen bromide (HBr) and methanol, but is not limited thereto, and a known etchant can be used. The light receiving part 4 may be formed by dry etching. Although not shown, after removing the etching mask, a photoresist film (for example, about 15 μm thick) is deposited in order to protect the main surface 3 side on which the light receiving part 4 is formed in the subsequent steps.

Figure 12:
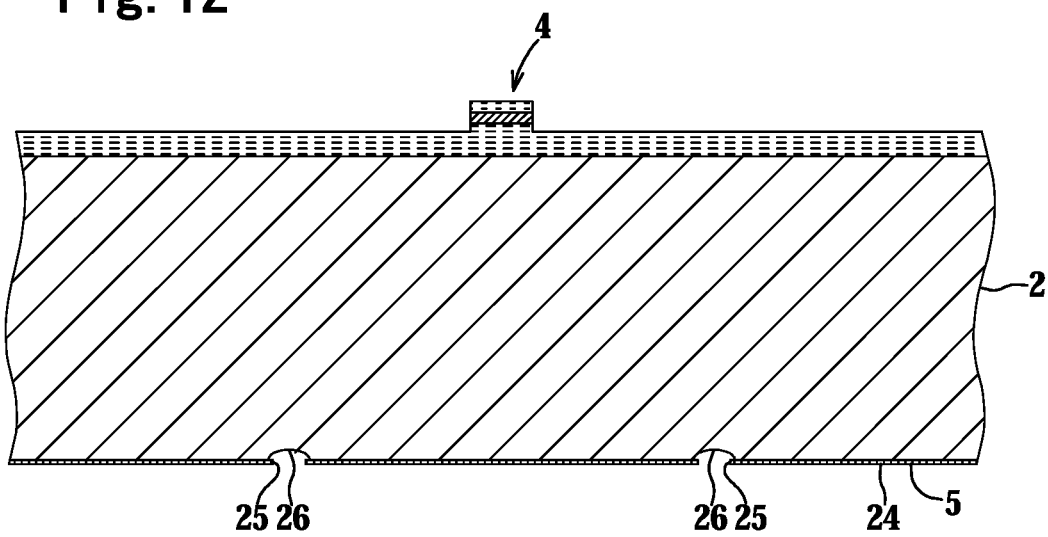
FIG. 12 is a sectional view showing a step of forming an annular groove in the semiconductor substrate of FIG. 11.

Next, as shown in FIG. 12, an annular groove 26 having a substantially circular shape in plan view is formed by a selective etching method on the back surface 5 of the semiconductor substrate 2 on which the light receiving portion 4 is formed. For example, in the silicon nitride film 24 formed on the back surface 5 as an etching mask, an opening 25 having a width of 20 μm where the back surface 5 of the semiconductor substrate 2 is exposed is formed in a circular shape in plan view. Then, the back surface 5 of the semiconductor substrate 2 exposed from the opening 25 is etched by the above-mentioned etching solution. Thus, an annular groove 26 having an outer diameter of 300 μm and a depth of 5 μm is formed on the back surface 5.

Figure 13:
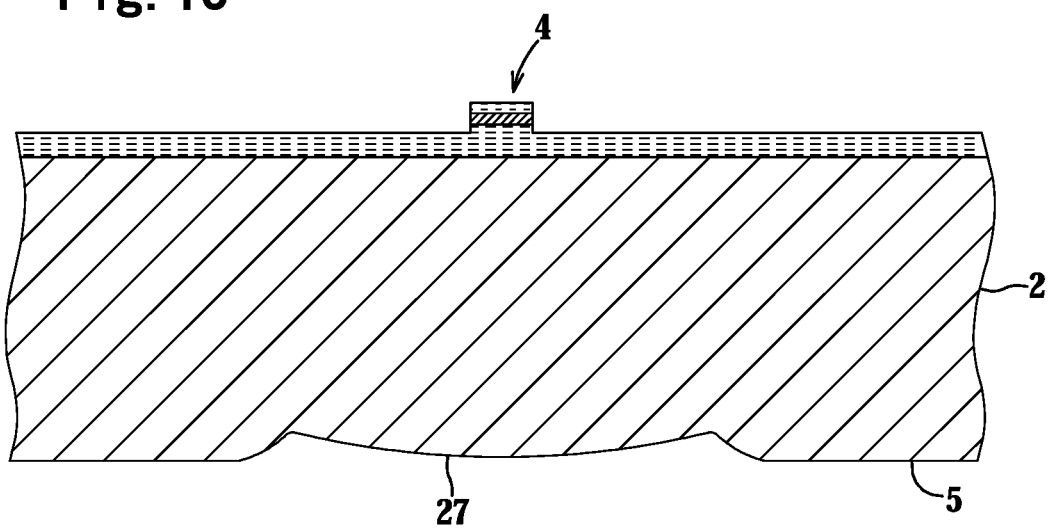
FIG. 13 is a cross-sectional view showing a step of forming a convex portion on the semiconductor substrate of FIG. 12.

Next, after removing the etching mask, as shown in FIG. 13, the entire back surface 5 of the semiconductor substrate 2 is etched with the above-mentioned etching solution for an appropriate time to form a curved surface 27 to be a partial spherical surface having a radius of curvature R constituting the concave reflecting portion 6. In the vicinity of the opening of the annular groove 26, the etching proceeds from two directions inside the annular groove 26 and on the back surface 5 side of the semiconductor substrate 2, so that the etching is accelerated as compared with the flat region of the back surface 5 where the etching proceeds from one direction. Therefore, a partially spherical curved surface portion 27 is formed in the inner region of the annular groove 26. Since the etching is promoted also in the vicinity of the opening of the annular groove 26 outside the annular groove 26, a curved surface is formed so as to smoothly continue from the annular groove 26 to a flat region.

Figure 14:
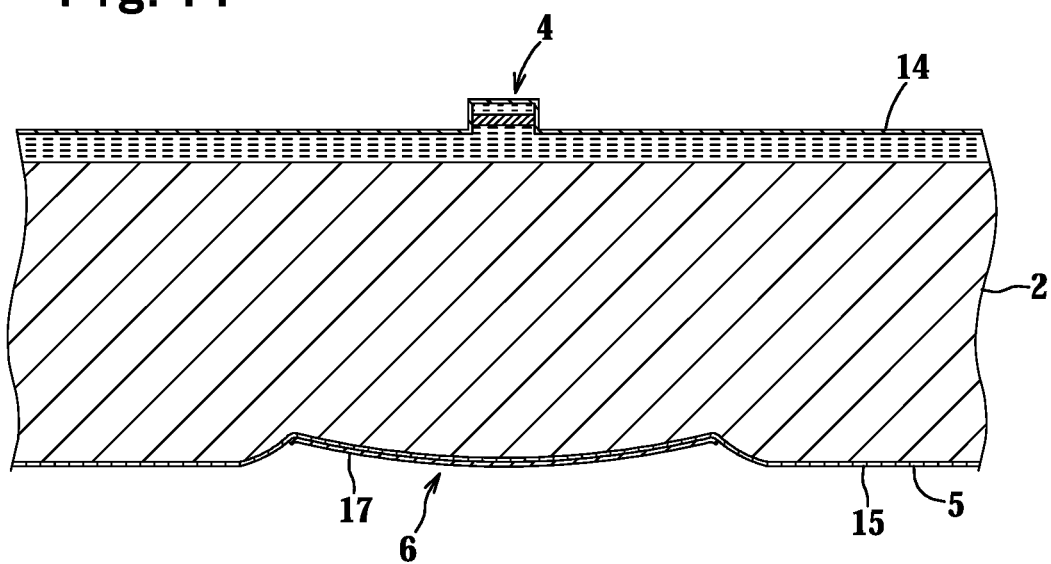
FIG. 14 is a cross-sectional view showing a step of forming a concave reflecting portion on the semiconductor substrate of FIG. 13.

Next, the photoresist film protecting the main surface 3 side is removed, and as shown in FIG. 14, an antireflection film 14 made of a silicon nitride film or the like is formed by a plasma CVD method or the like. Then, after a dielectric film 15 is formed as a reflective film on the back surface 5 of the semiconductor substrate 2 by a plasma CVD method or the like and a metal film 17 is formed by a vacuum evaporation method or the like, while leaving the metal film 17 of the curved surface portion 27, the metal film 17 is removed by a selective etching method or the like to form the concave reflecting portion 6. The metal film 17 is, for example, a laminated film of a chromium film and a gold film for improving the adhesion to the dielectric film 15.

Next, although not shown, a part of the antireflection film 14 covering the upper surface of the light receiving part 4 is removed to form the p-electrode 7, and a part of the dielectric film 15 on the back surface 5 of the semiconductor substrate 2 is removed to form the n-electrode 8 and diced to a predetermined size to obtain the semiconductor light receiving element 1 shown in FIGS. 1,2.

The operation and effect of the semiconductor light receiving element 1 according to the embodiment will be described.

As shown in FIG. 4, when incident light composed of parallel rays enters the incident area 16 having a diameter B in parallel with the axis Z of the light receiving part 4 from the main surface 3 side of the semiconductor light receiving element 1 where the light receiving part 4 is formed, part of the incident light enters the light absorption region 12 having the diameter P from the upper surface of the light receiving part 4. Incident light that has not entered the light absorbing region 12 from the upper surface of the light receiving part 4 is reflected by the partially spherical concave reflecting portion 6 so as to be focused toward the light absorbing region 12. Since the radius of curvature R of the concave reflecting portion 6 is set so as to satisfy the conditional expression (1), the incident light reflected by the concave reflecting portion 6 can be efficiently incident on the light absorption region 12 and, while restricting excessively condensing of incident light, the space charge effect in the light absorption region 12 can be suppressed. Therefore, the response speed can be increased by making the light absorption region 12 smaller than the incident region 16, and the sensitivity can be improved by securing an effective light receiving area corresponding to the area of the incident region 16. In addition, since a light receiving area larger than the light absorbing region 12 is secured, even if the light absorbing region 12 is made smaller, it is possible to suppress a decrease in sensitivity due to a deviation in the incident position of the incident light.

Figure 15:
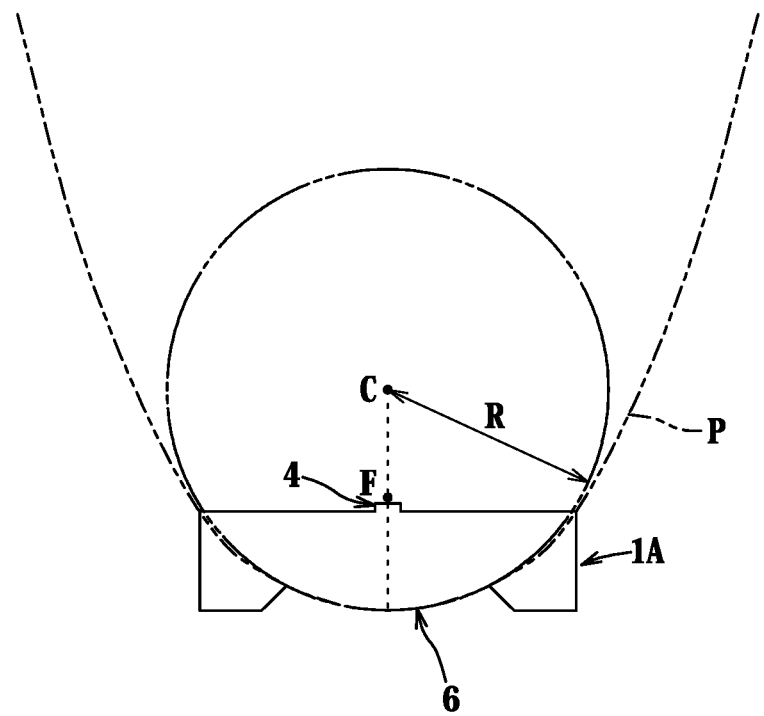
FIG. 15 is a diagram illustrating a semiconductor light receiving element having a concave reflecting portion of rotating paraboloid shape approximated by a partial spherical surface.

The concave reflecting portion 6 may be formed in the shape of a rotating paraboloid obtained by rotating the parabola P as shown in FIG. 15. The semiconductor light receiving element 1A having the radius of curvature R representing a partial spherical surface approximating the rotating paraboloid so as to satisfy the conditional expression (1) has the same operation and effect as the semiconductor light receiving element 1 of the above embodiment. Since the rotating paraboloid is difficult to form using an etching solution, it is preferable to form the rotating paraboloid by dry etching or the like.

In addition, for a person skilled in the art, the present invention can be implemented in various different formats by including various other changes to the embodiments described above without deviating from the spirit of the present invention, and the present invention is to be considered as including variant embodiments of this type.

DESCRIPTION OF REFERENCE NUMERALS 1, 1A: Semiconductor light receiving element
2: Semiconductor substrate
3: Main surface
4: Light receiving part
5: Back side
6: Concave reflector
12: Light absorption area
16: incident area

The invention claimed is:

1. A semiconductor light receiving element including a light absorbing region formed in a vicinity of a main surface of a semiconductor substrate transparent to an incident light, an incident region set concentrically with the light absorbing region and larger than the light absorbing region, and a partially spherical concave reflecting portion provided on a back surface opposite to the main surface of the semiconductor substrate and capable of reflecting incident light incident on the incident region from a side of the main surface of the semiconductor substrate toward the light absorbing region; wherein, when a radius of curvature of the concave reflecting portion is R, a diameter of the incident region is B, a distance in the semiconductor substrate between the light absorbing region and the concave reflecting portion is W, and a diameter of the light absorbing region is P, then the radius of curvature R satisfies a condition of $R \leq 2BW/(B-P)$ in order to avoid reduction of a coupling efficiency, and satisfies a condition of $R \geq 2BW/(B-P/2)$ in order to avoid a space charge effect.

2. A semiconductor light receiving element including a light absorption region formed in a vicinity of a main surface of a semiconductor substrate transparent to an incident light, an incident region set concentrically with the light absorption region and larger than the light absorption region, and a revolving paraboloid shaped concave reflecting portion provided on a back surface opposite to the main surface of the semiconductor substrate and capable of reflecting incident light incident on the incident region from a side of the main surface of the semiconductor substrate toward the light absorbing region;

wherein, when a radius of curvature of a partial spherical surface approximating a revolving paraboloid shape of the concave reflecting portion is R, a diameter of the incident region is B, a distance in the semiconductor substrate between the light absorbing region and the concave reflecting portion is W, and a diameter of the light absorbing region is P, then the radius of curvature R satisfies a condition of $R \leq 2BW/(B-P)$ in order to avoid reduction of a coupling efficiency, and satisfies a condition of $R \geq 2BW/(B-P/2)$ in order to avoid a space charge effect.

\* \* \* \* \*